United States Patent
Boguslawski et al.

(10) Patent No.: US 12,406,029 B2
(45) Date of Patent: Sep. 2, 2025

(54) METHOD FOR CLASSIFYING A PARTIAL DISCHARGE IN AN ELECTRICAL CONDUCTOR OF A MEDIUM VOLTAGE ELECTRICAL DEVICE

(71) Applicant: Schneider Electric Industries SAS, Rueil Malmaison (FR)

(72) Inventors: Bartosz Boguslawski, Grenoble (FR); Diego Alberto, Corenc (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 441 days.

(21) Appl. No.: 17/967,944

(22) Filed: Oct. 18, 2022

(65) Prior Publication Data

US 2023/0130883 A1  Apr. 27, 2023

(30) Foreign Application Priority Data

Oct. 25, 2021  (FR) ...................................... 2111326

(51) Int. Cl.
  *G01R 13/14*   (2006.01)
  *G06F 18/2415* (2023.01)
  *G06F 18/2431* (2023.01)

(52) U.S. Cl.
  CPC ...... *G06F 18/2415* (2023.01); *G06F 18/2431* (2023.01)

(58) Field of Classification Search
  CPC ............ G01R 31/1209; G01R 31/1218; G01R 31/1227; G01R 31/1272; G01R 31/1245; G01R 31/1254; G01R 31/1263; G01R 31/081; G01R 31/083; G01R 31/52; G01R 31/58; G01R 31/62; G06F 18/2415; G06F 18/2431
  See application file for complete search history.

(56) References Cited

U.S. PATENT DOCUMENTS

| | | | |
|---|---|---|---|
| 11,831,138 B2 * | 11/2023 | Wang | H02H 1/0015 |
| 2012/0022809 A1 * | 1/2012 | Serra | G01R 31/08 |
| | | | 702/59 |
| 2015/0185270 A1 | 7/2015 | Xie et al. | |
| 2017/0168024 A1 * | 6/2017 | Dehghan Niri | G01R 31/1227 |
| 2021/0231747 A1 * | 7/2021 | Yamada | G01R 31/52 |
| 2022/0163578 A1 * | 5/2022 | Marshall | G01R 31/086 |

FOREIGN PATENT DOCUMENTS

WO  2020160590 A1  8/2020

OTHER PUBLICATIONS

French Search Report and Written Opinion dated Jul. 6, 2022 for corresponding French Patent Application No. FR2111326, 9 pages.

* cited by examiner

*Primary Examiner* — Thang X Le
(74) *Attorney, Agent, or Firm* — Troutman Pepper Locke LLP (57) ABSTRACT

A method for classifying a partial discharge in an insulator of an electrical conductor of a medium voltage or high voltage electrical device, the method allowing a partial discharge to be classified from between at least one first class and a second class distinct from the first class. The method includes: obtaining a set of samples each corresponding to at least one partial discharge, determining a classification model by automatic learning based on at least one statistical quantity of the samples of the set, acquiring a new sample corresponding to at least one partial discharge, and determining the class of the partial discharge associated with the new sample acquired using the classification model.

11 Claims, 3 Drawing Sheets

METHOD FOR CLASSIFYING A PARTIAL DISCHARGE IN AN ELECTRICAL CONDUCTOR OF A MEDIUM VOLTAGE ELECTRICAL DEVICE

TECHNICAL FIELD

The present invention relates to the field of medium voltage or high voltage electrical devices.

PRIOR ART

Electrical devices operating at medium voltage or high voltage may be subjected to partial discharges between the electrical conductors and the neighbouring environment. A partial discharge is understood to mean an electrical discharge localized in an electrical insulator. The discharge is said to be partial because it does not short-circuit the whole of the insulator. These partial discharges may propagate in the air, or right inside the insulating material. These partial discharges do not affect the operation of the electrical device in question in the short term but do accelerate the aging of the insulators. When the insulators are too damaged, a direct electrical arc can occur which can lead to the destruction of the electrical device and pose significant risks for the people working nearby. Thus, the partial discharges must be detected in order to allow an intervention before any permanent damage, the destruction of the electrical device in question or a personal injury incident.

It is thus desirable to detect the appearance of partial discharges. For this purpose, various methods for detecting partial discharges are known. Generally speaking, when a partial discharge is detected, these detection methods allow a statistical analysis based for example on the values such as maximum, minimum, mean, median, but do not allow the class to which this partial discharge belongs to be determined. This means that it is not possible to know the origin of the partial discharge or discharges detected. Thus, the origin of the partial discharges detected may be difficult to identify and consequently to correct.

There exists a need to provide a method allowing the origin of partial discharges likely to occur in a medium- or high voltage electrical device to be determined by family of partial discharge (in the gas or the air, in the insulating materials or at the surface of these materials), in other words a classification of the type of the discharges detected to be established.

SUMMARY

For this purpose, the invention provides a method for classifying a partial discharge in an insulator of an electrical conductor of a medium voltage or high voltage electrical device, the method allowing a partial discharge to be classified from between at least a first class and a second class distinct from the first class, the method comprising the steps:
  obtain a set of samples each corresponding to at least one partial discharge,
  determine a classification model by automatic learning based on at least one statistical quantity of the samples of the set,
  acquire a new sample corresponding to at least one partial discharge,
  determine the class of the partial discharge associated with the new sample acquired using the classification model.

The method for classifying provided is based on an automatic learning in order to determine the class to which the partial discharge detected belongs. This automatic learning uses at least one statistical quantity, or statistical parameter, determined from a set of samples in which each sample corresponds to at least one partial discharge. By virtue of this principle, the partial discharges occurring during the operation of the electrical device may be more precisely characterized than with the methods according to the prior art. By virtue of the method for classifying the partial discharges, more effective corrective actions may be implemented.

The features listed in the following paragraphs may be implemented independently of one another or according to all the technically possible combinations:

Each sample from the set of samples, each corresponding to at least one partial discharge, is measured with at least one sensor. The sensor is configured for supplying an oscillating signal associated with the insulator of the electrical conductor.

According to one embodiment, the set of samples to be classified comprises for example two classes.

A first class of partial discharge is for example a partial discharge occurring in a connector connected to the electrical conductor of the electrical device.

A second class of partial discharge is for example a partial discharge occurring owing to a disconnection of an earthing system from the electrical device.

According to another embodiment, the set of samples to be classified comprises for example three distinct classes.

The set of samples to be classified may comprise more than three distinct classes.

Each sample acquired is a sample of an oscillating signal associated with the electrical conductor.

According to one embodiment, the oscillating signal is a signal representative of a vibration of the insulator of the electrical conductor.

The method for classifying the partial discharges also comprises prior steps first of all allowing the partial discharges to be detected. In order to detect the presence of a partial discharge, the method comprises the sub-steps:
  i) acquire a set of successive samples of an oscillating signal associated with the electrical conductor,
  ii) determine a modelled value of the next sample based on the set of acquired samples and on a prediction model, the prediction model being obtained by automatic learning from the oscillating signal,
  iii) acquire the next sample of the oscillating signal,
  iv) calculate a difference between the value of the sample acquired and the modelled value,
  v) if the difference calculated is higher than a predetermined threshold, detect a partial discharge in the electrical conductor, and the automatic learning is implemented based on a set of acquired samples under reference conditions in which the electrical conductor is devoid of any partial discharge.

According to one exemplary embodiment of the method, the voltage in the electrical conductor is periodic with a period T, the new acquired sample is obtained by integration of an oscillating signal over an acquisition time window, and the duration of the acquisition time window is equal to a multiple of the period of the voltage.

Preferably, the multiple of the period of the voltage is an integer value for example in the range between 1 and 10.

The duration of the acquisition time window is for example equal to the period of the voltage, preferably equal to three times the period of the voltage, more preferably equal to five times the period of the voltage.

As a variant, the duration between two successive samples of the signal from the sensor is less than one tenth of the period of the voltage, preferably less than the period divided by 20.

According to one embodiment, the method comprises the step:
  determine a duration separating two consecutive samples from the set of samples each corresponding to at least one partial discharge, and in which the statistical quantity from the set of samples to be classified comprises the duration separating two consecutive samples from the set of samples to be classified.

According to one embodiment, the method comprises the step:
  calculate a distribution function for the values of each sample of the set of samples to be classified.

According to one exemplary embodiment of the method, the statistical quantity comprises the coefficient of asymmetry of the distribution function obtained.

As a variant or in a complementary manner, the statistical quantity comprises the coefficient of flattening of the distribution function obtained.

According to one embodiment, the statistical quantity comprises the coefficient of asymmetry and the coefficient of flattening of the distribution function obtained.

According to one embodiment, the method comprises the step:
  determine from amongst the set of samples, each corresponding to at least one partial discharge, a fraction of samples having a positive value, and the statistical quantity comprises the fraction of samples having a positive value.

As a variant or in a complementary manner, the method comprises the step:
  determine from amongst the set of samples, each corresponding to at least one partial discharge, a fraction of samples having a negative value, and the statistical quantity comprises the fraction of samples having a negative value.

According to one embodiment, the voltage exhibits periodic variations, and the statistical quantity comprises a phasing of the new sample acquired with respect to the periodic variations of the voltage.

According to one embodiment, the method comprises, successively, the steps:
  acquire a set of reference samples comprising a first sub-set corresponding to the first class and a second sub-set corresponding to the second class,
  drive the classification model with at least a part of the set of reference samples.

Preferably, the set of reference samples is obtained under reference conditions in which partial discharges take place in the electrical conductor.

The set of reference samples comprises for example between 100 and 500 samples.

According to one example of use of the method, the classification model is driven by using for example 70% of the samples of the set of reference samples.

According to this exemplary use of the method, the classification model is tested by using for example 30% of the samples of the set of reference samples.

According to one embodiment of the method, the latter comprises, successively, the steps:
  acquire a set of reference samples comprising a first sub-set corresponding to the first class and a second sub-set corresponding to the second class,
  determine a mean (Moy) and a standard deviation (S) of the samples of the set of reference samples,
  normalize the values of the set of reference samples so as to obtain a set of normalized reference samples, the normalized value (Eref_$N_k$) of a sample (Eref$_k$) being equal to:

$$\text{ERef\_N}_k = \left(\frac{ERef_k - Moy}{S}\right)$$

drive the classification model with at least a part of the values of the set of normalized values.

For example, the step for normalizing the values of the set of samples to be classified comprises the steps:
  determine the mean and the standard deviation of the samples of the set of reference samples,
  for each sample of the first sub-set, calculate a corrected value, the corrected value being obtained by subtracting the value of the mean determined from the sample value, then by dividing the result of the subtraction by the standard deviation determined,
  for each sample of the second sub-set, calculate a corrected value, the corrected value being obtained by subtracting the value of the mean determined from the sample value, then by dividing the result of the subtraction by the standard deviation determined.

The invention also relates to a medium voltage or high voltage electrical device, the electrical device comprising:
  an electrical conductor,
  a sensor configured for supplying an oscillating signal associated with an insulator of the electrical conductor,
  an electronic control unit configured for implementing the method for classifying a partial discharge such as previously described.

According to one embodiment, the sensor is configured for supplying a signal representative of a vibration of the insulator of the electrical conductor.

The sensor is a vibration sensor.

The sensor is configured for supplying a signal representative of an acceleration of the insulator of the electrical conductor.

The vibration sensor is fixed to an external surface of the electrical conductor. More precisely, the electrical conductor is surrounded by an insulator forming a sheath, and the vibration sensor is fixed onto the external surface of the insulator.

The vibration sensor is a sensor of the piezo-electric type.

According to one embodiment, the bandwidth of the vibration sensor is in the range between 1 kHz and 300 kHz.

According to one exemplary embodiment of the method, the vibration sensor delivers an analogue signal.

As a variant, the vibration sensor delivers a digital signal.

BRIEF DESCRIPTION OF THE DRAWINGS

Other features, details and advantages will become apparent upon reading the detailed description hereinafter, and upon analyzing the appended drawings, in which.

DESCRIPTION OF THE EMBODIMENTS

In order to facilitate the reading of the figures, the various elements are not necessarily shown to scale. In these figures, identical elements carry the same references. Some elements or parameters may be indexed, in other words denoted for example by first element or second element, or else first parameter and second parameter, etc. This indexation is aimed at differentiating similar elements or parameters, but not identical. This indexation does not imply a priority of one element, or parameter, with respect to another and the denominations are interchangeable. When it is stated that a device comprises a given element, this does not exclude the presence of other elements in this device.

Figure 1:
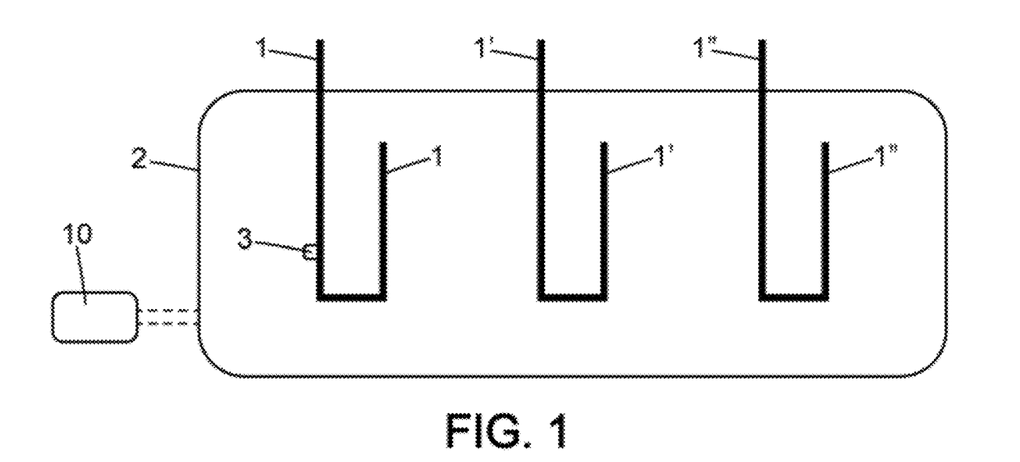
FIG. 1 is a schematic representation of an electrical device in which the method according to the invention is implemented.

FIG. 1 shows a medium voltage and high voltage electrical device 2, the electrical device 2 comprising:
- an electrical conductor 1,
- a sensor 3 configured for supplying an oscillating signal V associated with an insulator 5 of the electrical conductor 1,
- an electronic control unit 10 configured for implementing the method for classifying a partial discharge according to the invention.

The electrical device 2 comprises several electrical conductors. For example, the electrical device 2 comprises three electrical conductors 1, 1',1" corresponding to the three phases of a three-phase electrical supply network. The method according to the invention is to be applied to each of the electrical conductors 1, 1',1".

The electrical device 2 is a medium voltage unit, in other words a voltage in the range between 1 kV and 52 kV. The electrical device 2 may also be a high voltage unit. The electrical device 2 may for example be a circuit breaker, an isolating device or a switch. Furthermore, the invention may also just as well be applied both to AC and to DC current, notably when a periodicity of the electrical current is not mentioned or required.

Figure 7:
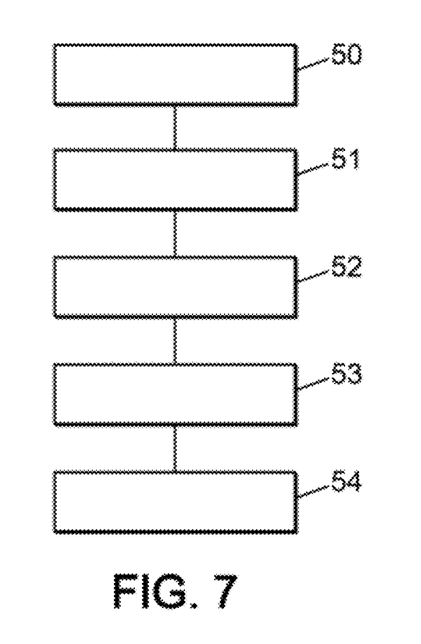
FIG. 7 is a schematic diagram illustrating various steps of the method according to the invention.

The method according to the invention is a method for classifying a partial discharge in an insulator 5 of an electrical conductor 1 of a medium voltage or high voltage electrical device 2, the method allowing a partial discharge to be classified from between at least a first class C1 and a second class C2 distinct from the first class C1, the method comprising the steps:
- obtain a set P of samples $E_1 \ldots, E_n$ each corresponding to at least one partial discharge, (step 51)
- determine a classification model M2 by automatic learning based on at least one statistical quantity G of the samples of the set P, (step 52)
- acquire a new sample $E_{n+1}$ corresponding to at least one partial discharge, (step 53)
- determine the class C1, C2 of the partial discharge associated with the new sample acquired $E_{n+1}$ using the classification model M2. (step 54)

The classification method provided is based on an automatic learning for determining the class to which the partial discharge detected belongs. This automatic learning uses at least one statistical quantity, or statistical parameter, determined from a set of samples in which each sample corresponds to at least one partial discharge. By virtue of this principle, the partial discharges occurring during the operation of the electrical device may be more precisely characterized than with the methods according to the prior art. By virtue of the method for classifying the partial discharges, the origin and the localization of the partial discharges may be determined more precisely, which allows more effective corrective actions to be implemented.

Each sample of the set P corresponds to at least one partial discharge, in other words the occurrence of at least one partial discharge is associated with this sample. It is possible for several partial discharges to occur within the interval of time separating two successive samples. In this case, several occurrences of partial discharges are associated with the same sample.

Figure 4:
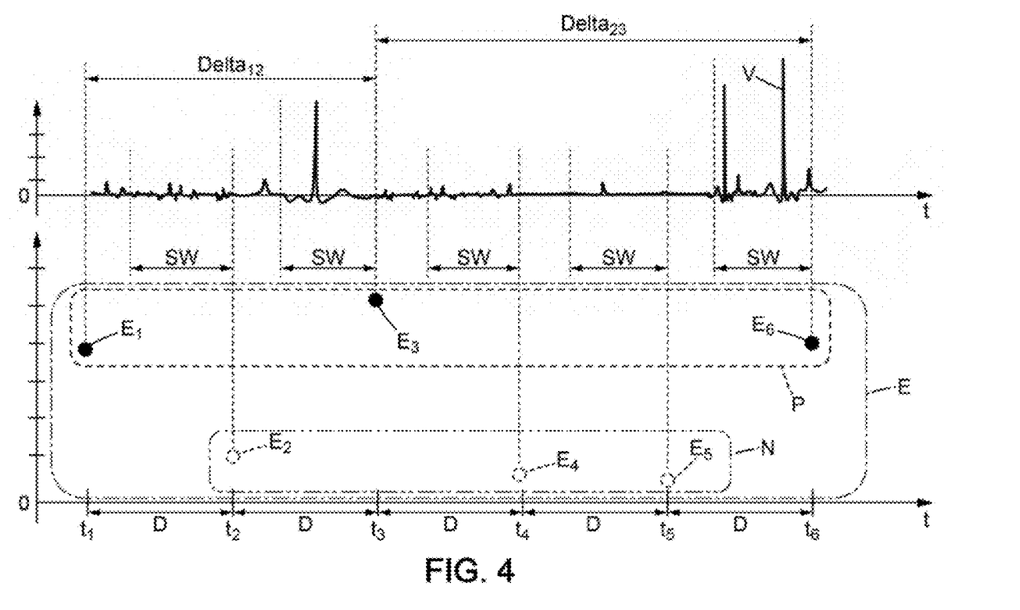
FIG. 4 is another representation of the time variation of parameters of the method according to the invention.

The set P of samples, each corresponding to at least one partial discharge, is a sub-set of the set E of the acquired samples. The set E of the acquired samples also comprises samples for which no partial discharge has taken place. In other words, the set E of the acquired samples comprises the sub-set P of the samples corresponding to at least one partial discharge and the sub-set N of the samples each corresponding to the absence of a partial discharge. A determination of the class of the partial discharge, in other words of the type of partial discharge, is carried out for the set P of the samples corresponding to at least one partial discharge. No classification is made for the sub-set N of the samples where each corresponds to the absence of a partial discharge. FIG. 4 illustrates schematically the set E of all the samples acquired over time, the sub-set P of the samples associated with a partial discharge, and the sub-set N of the samples for which no partial discharge has occurred. For reasons of clarity, only a few samples have been shown. The samples $E_1$, $E_3$ and $E_6$ are associated with the occurrence of a partial discharge. The samples $E_2$, $E_4$, $E_5$ are associated with the absence of a partial discharge.

Figure 2:
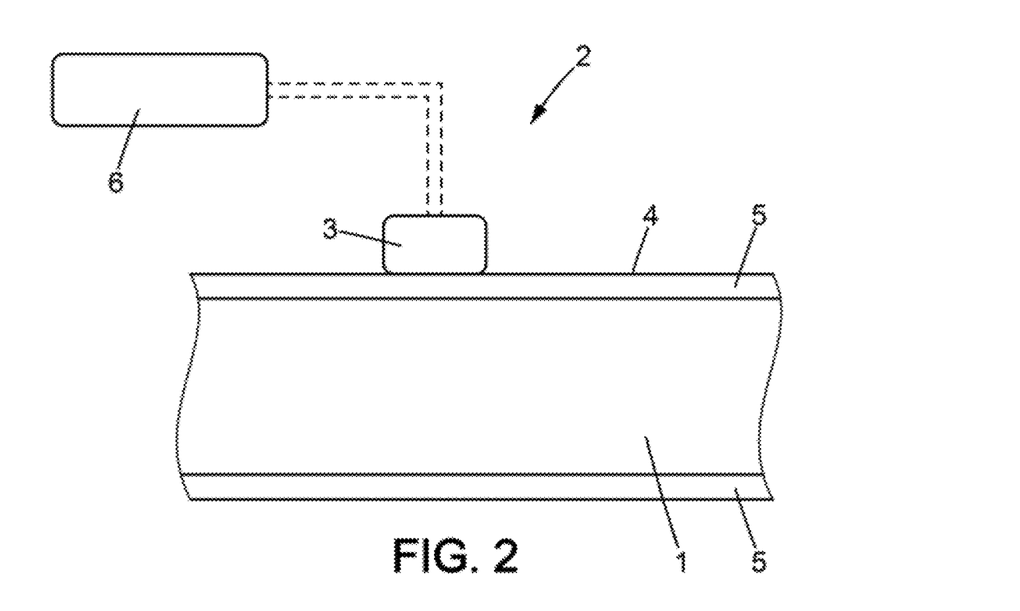
FIG. 2 is a detailed schematic representation of the electrical device in FIG. 1.

Each sample $E_1 \ldots, E_n$ of the set P of samples, each corresponding to at least one partial discharge, is measured with at least one sensor 3. The sensor 3 is configured for supplying an oscillating signal associated with the insulator 5 of the electrical conductor 1. In other words, the sensor 3 is configured for supplying a signal representative of a vibration of the insulator 5 of the electrical conductor 1. The insulator 5 surrounds the electrical conductor 1 and forms an insulating sheath around the latter.

The sensor 3 is a vibration sensor. As shown schematically in FIG. 2, the vibration sensor 3 is fixed to an external surface 4 of the electrical conductor 1. More precisely, the electrical conductor 1 is surrounded by an insulator 5 forming a sheath. The vibration sensor 3 is fixed onto the external surface of the insulator 5. The vibration sensor 3 is rigidly attached to the external surface 4 of the electrical conductor 1. The vibration sensor 3 thus measures the vibrations propagating on the surface of the electrical conductor in the neighbourhood of the sensor 3.

The vibration sensor 3 is for example a sensor of the piezo-electric type. In other words, the sensor 3 comprises a piezo-electric element and the mechanical vibrations of the electrical conductor 1 modify the pressure exerted on the piezo-electric element. An electrical voltage thus appears across the terminals of the piezo-electric element. This electrical voltage across the terminals of the piezo-electric element is amplified so as to supply a usable output signal. An electronic processing module module 6 allows the signal from the sensor 3 to be processed. This module 6 for processing the signal may be distinct from the electronic control unit 10. According to another exemplary embodiment, the module 6 for processing the signal may form part of the electronic control unit 10.

According to one embodiment, the bandwidth of the vibration sensor 3 is in the range between 1 kHz and 300 kHz.

According to the embodiment illustrated, the sensor 3 is configured for supplying a signal V representative of an acceleration of the insulator 5 of the electrical conductor 1. In other words, the sensor 3 is an acceleration sensor.

According to one exemplary embodiment of the method, the vibration sensor 3 delivers an analogue signal. As a variant, the vibration sensor 3 delivers a digital signal.

The successive samples $E_1, \ldots, E_n$ of the signal from the sensor 3 respectively correspond to successive measurement times $t_1, \ldots, t_n$. When a set S of successive samples $E_1, \ldots, E_n$ has been acquired and when the sample $E_n$ is the most recent sample, the next sample $E_{n+1}$ corresponds to the value supplied by the sensor at the time When a partial discharge is determined, the partial discharge determined took place between the time $t_n$ and the time $t_{n+1}$.

A measurement sample $E_n$ of the signal from the sensor 3 may correspond for example to a value sampled at a given moment in time $t_n$ of the instantaneous signal from the sensor 3.

The acquisition of the successive samples $E_1, \ldots, E_n$ of the signal from the sensor 3 may be carried out with a fixed sampling frequency. As a variant, the acquisition of the successive samples $E_1, \ldots, E_n$ of the signal from the sensor 3 may be carried out with a variable sampling frequency.

The sampling frequency is in the range between 1 kHz and 1000 kHz.

According to one embodiment, the set P of samples to be classified comprises for example two classes C1, C2.

A class corresponds to the origin of the partial discharge, in other words to the family of the partial discharge which has taken place. In other words, a class corresponds to a type of partial discharge.

A first class C1 of partial discharge is for example a partial discharge occurring in a connector connected to the electrical conductor 1 of the electrical device 2.

A second class C2 of partial discharge is for example a partial discharge occurring due to a disconnection of an earthing system from the electrical device 2.

The names first class C1 and second class C2 do not imply a particular importance of one class with respect to the other class.

According to another embodiment, the set P of samples to be classified comprises for example three distinct classes C1, C2, C3. The set P of samples to be classified may also comprise more than three distinct classes.

Each sample acquired is a sample of an oscillating signal V associated with the electrical conductor 1. The oscillating signal V is a signal representative of a vibration of the insulator 5 of the electrical conductor 1. In the illustrative figures, a high value of the oscillating signal V corresponds to high vibration values. Conversely, a signal close to zero corresponds to low vibration values.

Figure 3:
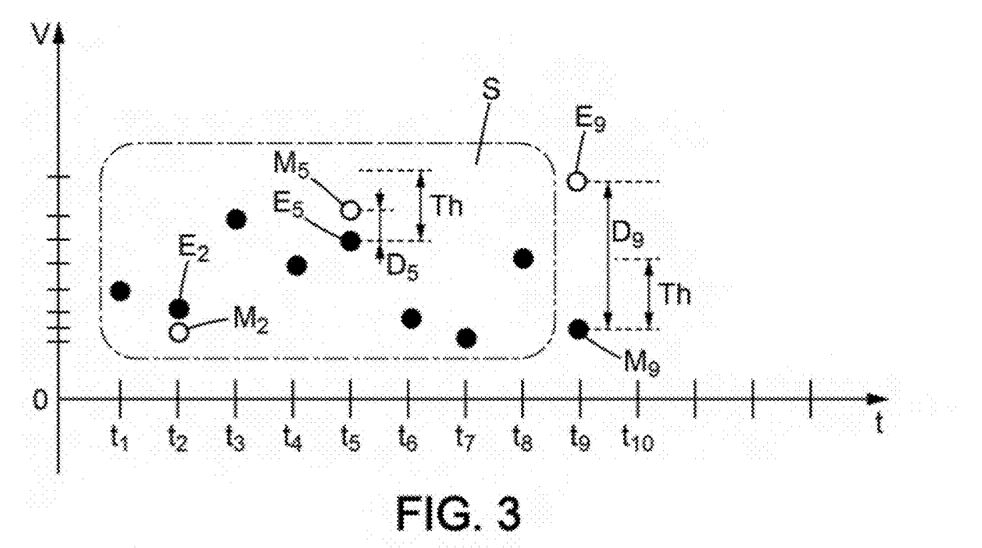
FIG. 3 is a schematic representation of the time variation of parameters of the method according to the invention.

The method for classifying partial discharges also comprises prior steps first of all allowing the partial discharges to be detected. In order to detect the presence of a partial discharge, the method comprises the sub-steps:

i) acquire a set $S_n$ of successive samples $E_1, \ldots, E_n$ of an oscillating signal V associated with the electrical conductor 1, ii) determine a modelled value $M_{n+1}$ of a next sample $E_{n+1}$ based on the set $S_n$ of acquired samples and on a prediction model M1, the prediction model M1 being obtained by automatic learning of the oscillating signal V based on a set $V_p$ of samples acquired under reference conditions CRef in which the electrical conductor 1 is devoid of any partial discharge, iii) acquire the next sample $E_{n+1}$ of the oscillating signal V, iv) calculate a difference $D_{n+1}$ between the value of the acquired sample $E_{n+1}$ and the modelled value $M_{n+1}$, v) if the calculated difference $D_{n+1}$ is greater than a predetermined threshold Th, detect a partial discharge in the electrical conductor 1.

The sub-steps allowing a detection of the partial discharges in the electrical conductor 1 are based both on a measurement actually made of an oscillating signal V associated with the electrical conductor 1, and on a prediction model M1 calculating the expected time variation of this oscillating signal V. Too large a difference between the modelled signal and the signal actually measured indicates that a partial discharge has taken place. Since the prediction model M1 is obtained by automatic learning, the latter may thus be automatically adapted to the real characteristics of each electrical device 2 for which the method is implemented. The dispersions of the characteristics between electrical devices are thus automatically taken into account, which facilitates the setup of the method and also its effectiveness.

FIG. 3 illustrates schematically the sub-steps for detection of a partial discharge.

The point $E_2$ represents the value of the signal V measured at the time $t_2$. The point $E_5$ represents the value of the signal V measured at the time $t_5$, and the point $E_9$ represents the value of the signal V measured at the time $t_9$. The point $M_5$ represents the value modelled by the prediction model M1 of the sample $E_5$, and similarly, the point $M_9$ represents the modelled value of the sample $E_9$. In order to simplify the figure, the points $M_1$, $M_3$ together with $M_6$ to $M_8$ have not been shown. The difference $D_9$ between the acquired sample $E_9$ and the modelled value $M_9$ is greater than the threshold Th. This therefore indicates that an abnormal event has occurred between the time is and the time $t_9$. The difference $D_5$ between the acquired sample $E_5$ and the modelled value $M_5$ is less than the threshold Th. This indicates that no abnormal event has occurred between the time $t_4$ and the time $t_5$. In order to simplify FIG. 3, only positive values of the signal V have been shown, but the signal may also take negative values.

The set S of successive samples $E_1, \ldots, E_n$ of the signal from the sensor 3, taken into account for determining a modelled value $M_{n+1}$ of the next sample $E_{n+1}$, comprises a fixed number of samples, the fixed number of samples being for example in the range between 10 and 20. For example, the modelled value of the next sample is obtained based on the 15 previously acquired samples. More generally the set S of successive samples $E_1, \ldots, E_n$ of the signal from the sensor 3, taken into account for determining a modelled value $M_{n+1}$ of the next sample $E_{n+1}$, may comprise a number of samples for example in the range between 4 and 20.

In the case where the measured value $E_{n+1}$ is far from the predicted value $M_{n+1}$, the measurement point corresponds to a partial discharge. The partial discharge detected is subsequently classified by the method according to the invention, in other words the type of the partial discharge is determined. When the measured value $E_{n+1}$ is close to the predicted value $M_{n+1}$, the measurement sample $E_{n+1}$ corresponds to an operation with no partial discharge. The measurement sample $E_{n+1}$ is not therefore integrated into the set P of the points for which a classification of the partial discharges is carried out.

The automatic learning of the prediction model M1 is implemented based on a set $V_p$ of samples acquired under reference conditions CRef in which the insulator 5 of the electrical conductor 1 is devoid of any partial discharge. The automatic learning is thus implemented based on a set $V_p$ of samples in which the partial discharges to be detected are absent. The set of the possible values of the oscillating signal in the absence of a partial discharge can thus be characterized, and corresponds to the nominal noise of the oscillating signal in the absence of a partial discharge. The automatic learning of the nominal noise of the oscillating signal allows the performance of the steps for detection of a partial discharge to be improved, both for the rate of non-detection and for the rate of false detection. These learning conditions of the prediction model M1 are a period of operation starting at the first power up of the electrical device 2 and of duration equal to a first predetermined duration of use D1 of the electrical device 2. In other words, the first predetermined duration of use D1 during which the automatic learning of the prediction model M1 may be implemented corresponds to the operation in the brand new state of the electrical device 2. During this period, the operation of the electrical device 2 is devoid of any partial discharge. In other words, during this period no undesirable abnormal event occurs, and the signal delivered by the sensor 3 corresponds to the residual measurement noise. Since the degradation of the dielectric properties of the electrical device 2 are a slow phenomenon, the brand new state of the electrical device may last in reality for several tens of hours.

According to one exemplary embodiment of the method, the voltage in the electrical conductor 1 is periodic with a period T, the new acquired sample $E_{n+1}$ is obtained by integration of an oscillating signal V over an acquisition time window SW, and a duration D of the acquisition time window SW is equal to a multiple k of the period T of the voltage.

The power supply voltage of the electrical device 2 is periodic with a period T. The time between two successive samples may be longer than the duration of the time window SW.

Preferably, the multiple k of the period T of the voltage is an integer value in the range for example between 1 and 10. The multiple k can take all the integer values between 1, value included, and 10, value also included.

The duration D of the acquisition time window SW is for example equal to the period T of the voltage, preferably equal to three times the period T of the voltage, more preferably equal to five times the period T of the voltage. In the analysis, only the time windows in which at least one partial discharge is identified are of course considered.

By increasing the duration of acquisition during which the oscillating signal is analyzed, the precision of the classification may be improved. In other words, the rate of correct identification of the class of the partial discharge is enhanced. The latter may go for example from a value of 85%, when each sample corresponds to a duration equal to one period of the voltage, to a value of 97% when each sample corresponds to a duration equal to five times the period of the voltage.

As a variant, a duration D between two successive samples $E_1, \ldots, E_n$ of the signal from the sensor 3 is less than one tenth of the period T of the voltage, preferably less than the period T divided by 20. A short time between two successive samples allows a phasing of the partial discharges detected with respect to the variations of the voltage of the electrical device 2 to be determined.

According to one embodiment, the method comprises the step:
determine a duration Delta separating two consecutive samples of the set P of samples each corresponding to at least one partial discharge, and in which the statistical quantity G of the set P of samples to be classified comprises the duration Delta separating two consecutive samples of the set P of samples to be classified.

In the example in FIG. 4, the duration $Delta_{12}$ corresponds to the time that has passed between the sample $E_1$, corresponding to the first occurrence of a partial discharge, and the sample $E_3$ which corresponds to the second occurrence of a partial discharge. The duration $Delta_{23}$ corresponds to the duration between the sample $E_3$ and the sample $E_6$, the sample $E_6$ corresponding to the third occurrence of a partial discharge. Indeed, the samples $E_2$, $E_3$ and $E_4$ are representative of the absence of a partial discharge.

The duration Delta separating two consecutive samples of the set P may be expressed in absolute time. This means that the duration Delta is equal to the difference of the value of the time of acquisition of a sample belonging to the set P and of the value of the time of acquisition of the preceding sample belonging to the set P.

Alternatively, the duration Delta separating two consecutive samples of the set P may be expressed in relative time. This means that the duration Delta is equal to the number of acquisition time windows separating two successive samples belonging to the set P. The duration Delta is then equal to the ratio of the difference of the value of the time of acquisition of a sample belonging to the set P and the value of the time of acquisition of the preceding sample belonging to the set P, and of the duration SW of the acquisition time window.

According to one embodiment, the method comprises the step:
calculate a distribution function D of the values of each sample of the set P of samples to be classified.

The method thus comprises a step in which a distribution of the value of the samples is established. More precisely, the set of the values of the samples of the set P is divided up into a set of contiguous intervals, and the probability that a sample belongs to a given interval is determined. For this purpose, the number of samples belonging to each interval is determined, and divided by the total number of samples. Preferably, the intervals have the same width. The set of the values of the acquired samples may for example be divided up into 10 intervals.

Figure 5:
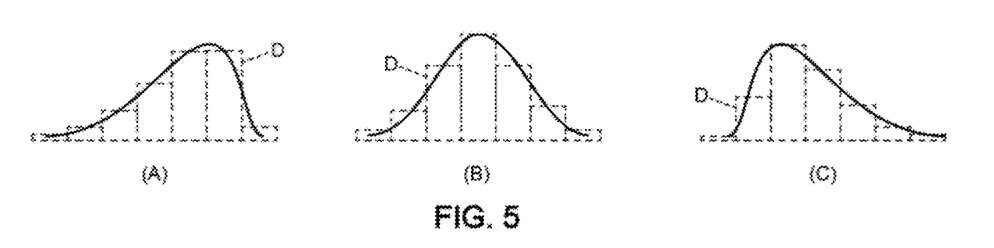
FIG. 5 is a schematic representation of statistical parameters of the method.

According to one exemplary embodiment of the method, the statistical quantity G comprises the coefficient of asymmetry of the distribution function D obtained. The coefficient of asymmetry of a random variable X with a mean M and a standard deviation S is understood to mean the mathematical expectation value of the quantity:

$$\left[\left(\frac{X-M}{S}\right)^3\right]$$

In other words, the degree of symmetry of the distribution D obtained is taken into account in order to establish the classification of the partial discharges.

FIG. 5 illustrates various coefficients of asymmetry. The part A in FIG. 5 illustrates a negative coefficient of asymmetry, in other words the distribution is shifted to the right of the median. The part B corresponds to a coefficient of asymmetry zero, for which the distribution is symmetrical. The part C illustrates a positive coefficient of asymmetry, in other words the distribution is shifted to the left of the median.

Figure 6:
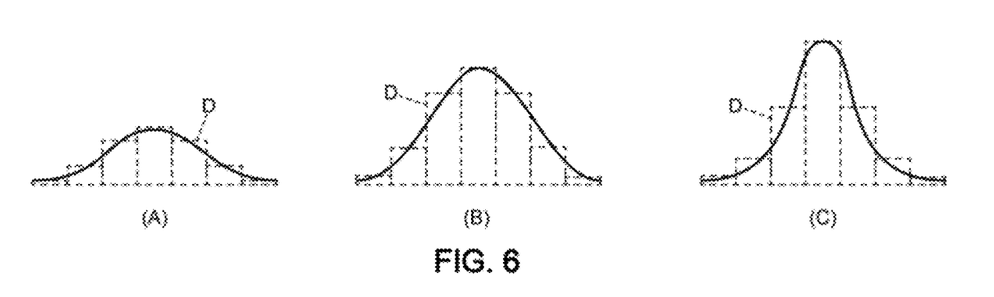
FIG. 6 is a schematic representation of other statistical parameters of the method.

As a variant or in a complementary manner, the statistical quantity G comprises the coefficient of flattening of the distribution function D obtained. The coefficient of flattening of a random variable X with a mean M and a standard deviation S is understood to mean the mathematical expectation value of the quantity:

$$\mathbb{E}\left[\left(\frac{X-M}{S}\right)^4\right]$$

In other words, the degree of flattening of the distribution D obtained is taken into account in order to establish the classification of the partial discharges.

FIG. 6 illustrates various coefficients of flattening. The part A in the figure shows a negative coefficient of flattening of the distribution D, for which the distribution is flatter than the normal distribution. The part B shows a coefficient of flattening zero which corresponds to the normal distribution. The part C shows a positive coefficient of flattening, for which the distribution D is more peaked than the normal distribution.

According to one embodiment, the statistical quantity G comprises the coefficient of asymmetry and the coefficient of flattening of the distribution function D obtained. The coefficient of asymmetry and the coefficient of flattening are thus used jointly in order to establish the classification of the set of the partial discharges. The joint use of these two statistical parameters allows the precision of the classification to be improved with respect to the use of a single parameter.

According to one embodiment, the method comprises the step:
determine from amongst the set P of samples $E_1, \ldots, E_n$, each corresponding to at least one partial discharge, a fraction of samples having a positive value, and the statistical quantity G comprises the fraction of samples having a positive value.

As a variant or in a complementary manner, the method comprises the step:
determine from amongst the set P of samples $E_1, \ldots, E_n$, each corresponding to at least one partial discharge, a fraction of samples having a negative value, and the statistical quantity G comprises the fraction of samples having a negative value.

The fraction of samples having a negative value is the complementary value, with respect to 100%, of the fraction of samples having a positive value. For example, the set P of the samples corresponding to at least one partial discharge may comprise 80% of positive values and 20% of negative values. The distribution between the positive values and the negative values is another quantity allowing the classification of the partial discharges to be implemented.

According to one embodiment, the voltage exhibits periodic variations, and the statistical quantity G comprises a phasing of the new acquired sample $E_{n+1}$ with respect to the periodic variations of the voltage.

In other words, the relative position of the next sample acquired $E_{n+1}$ corresponding to a partial discharge, with respect to the cycle of the periodic variations of the voltage, is a criterion allowing the class of the partial discharge to be defined. For example, the sample corresponding to the partial discharge may be close to a maximum value, or to a minimum value of the voltage. The sample may also be near to the zero of the voltage. This indicates which type of partial discharge has taken place.

According to one embodiment, the method comprises, successively, the steps:
acquire a set PRef of reference samples comprising a first sub-set PRef_1 corresponding to the first class C1 and a second sub-set PRef_2 corresponding to the second class C2,
drive the classification model M2 with at least a part of the set PRef of reference samples.

The automatic learning of the classification model M2 is implemented based on a set PRef of reference samples comprising a first sub-set PREf_1 corresponding to the first class C1 and a second sub-set PRef_2 corresponding to the second class C2.

Preferably, the set PRef of reference samples is obtained under reference conditions CRef in which partial discharges take place in the electrical conductor 1.

The reference samples used to implement the automatic learning of the classification model M2 may for example be obtained with an aging unit of electrical equipment, in which partial discharges regularly take place.

The set PRef of reference samples comprises for example between 100 and 500 samples.

When the classification method comprises more than two classes, the set PRef of reference samples comprises as many sub-sets as classes to be identified. The automatic learning of the classification model M2 is implemented so as to identify each of the partial discharge classes.

The automatic learning of the classification model M2 is a supervised learning.

According to one example of use of the method, the classification model M2 is driven using for example 70% of the samples of the set PRef of reference samples. The samples taken into account for driving the classification model M2 are selected at random from amongst the set PRef of reference samples.

According to this example of use of the method, the classification model M2 is tested using for example 30% of the samples of the set PRef of reference samples.

The validation of the classification model M2 previously defined is thus carried out by using 30% of the data of the set PRef of reference samples. The samples taken into account in order to validate the classification model M2 are the samples remaining once the 70% of samples used for the learning have been selected.

The parameters of the classification model M2 are stored in an electronic control unit. Similarly, the parameters of the prediction model M1 are stored in an electronic control unit.

According to one embodiment of the method, the latter comprises, successively, the steps:
acquire a set PRef of reference samples ($ERef_1, \ldots, ERef_p$) comprising a first sub-set PRef_1 corresponding to the first class C1 and a second sub-set PRef_2 corresponding to the second class C2,
determine a mean Moy and a standard deviation S of the samples of the set PRef of reference samples,
normalize the values of the set PRef of reference samples so as to obtain a set PRef_N of normalized reference samples, the normalized value $Eref\_N_k$ of a sample ($Eref_k$) being equal to:

$$ERef\_N_k = \left(\frac{ERef_k - Moy}{S}\right)$$

drive the classification model M2 with at least a part of the values of the set (PRef_N) of normalized values.

After normalization, the set PRef_N of normalized reference samples comprises a sub-set PRef_N_1 corresponding to the first class C1 and a second sub-set PRef_N_2 corresponding to the second class C2. In other words, the data of the set P of the samples to be classified are normalized in a prior step before being used to drive the classification model M2. The classification model M2 is thus driven with the corrected values of the samples of the first class C1 and the corrected values of the samples of the second class C2.

More precisely, the step aimed at normalizing the values of the set P of samples to be classified comprises the steps:

determine the mean Moy and the standard deviation Ect of the samples ($Eref_1, \ldots, Eref_p$) of the set PRef of reference samples. This calculation integrates all the values of the set PRef of reference samples, in other words the elements of the first sub-set PRef_1 which corresponds to the first class C1, and the elements of the second sub-set PRef_2 which corresponds to the second class C2.

for each sample $Eref_i$ of the first sub-set PREf_1, the corrected value $Eref\_N_i$ is obtained by subtracting the value of the determined mean Moy from the value of sample $Eref_i$, then by dividing the result of the subtraction by the determined standard deviation Ect, this operation is iterated for all the samples of the first sub-set PRef_1, which corresponds to the first class C1.

similarly, for each sample $ERef_j$ of the second sub-set PREf_2, the corrected value $Eref\_N_j$ is obtained by subtracting the value of the determined mean Moy from the value of sample $Eref\_N_j$, then by dividing the result of the subtraction by the determined standard deviation Ect. This operation is also iterated for all the samples of the second sub-set PRef_2, which corresponds to the second class C2.

This change of variables allows a normalization of the data, in other words a data processing aimed at rendering the process independent of the amplitude of variation of the acquired samples. This step for normalizing the acquired data prior to their use by the process of automatic learning allows the quality of the learning to be improved. The rate of erroneous classification is thus reduced. The processing for normalization of the data is applied in the same manner when the classification comprises more than two distinct classes.

The invention claimed is:

1. A method for classifying at least one partial discharge emitted in an insulator of an electrical conductor of a medium voltage or high voltage electrical device, the method allowing the at least one partial discharge to be classified from between at least a first class and a second class distinct from the first class, the method comprising:
obtaining, by an electronic control unit, a set of samples, each sample of the set of samples corresponding to a respective at least one partial discharge emitted in the insulator of the electrical conductor, wherein each sample of the set of samples is measured with at least one sensor,
determining, by the electronic control unit, a duration separating two consecutive samples of the set of samples,
determining, by the electronic control unit, a classification model by automatic learning based on at least one statistical quantity of the samples of the set of samples, wherein the at least one statistical quantity of the samples of the set of samples comprises the duration separating the two consecutive samples of the set of samples,
acquiring, by the electronic control unit, a new sample corresponding to at least one new partial discharge, and
determining, by the electronic control unit, a class of the at least one new partial discharge based on the classification model.

2. The method according to claim 1, wherein voltage in the electrical conductor is periodic with a period, wherein the new sample is obtained by integration of an oscillating signal over an acquisition time window, and wherein a duration of the acquisition time window is equal to a multiple of the period of the voltage in the electrical conductor.

3. The method according to claim 1, comprising:
calculating a distribution function for values of each sample of the set of samples.

4. The method according to claim 3, wherein the at least one statistical quantity comprises a coefficient of asymmetry of the distribution function.

5. The method according to claim 3, wherein the at least one statistical quantity comprises a coefficient of flattening of the distribution function.

6. The method according to claim 1, comprising:
determining from among the set of samples, a fraction of samples having a positive value, wherein the at least one statistical quantity comprises the fraction of samples having a positive value.

7. The method according to claim 1, wherein the voltage in the electrical conductor exhibits periodic variations, and wherein the at least one statistical quantity comprises a phasing of the new sample acquired with respect to the periodic variations of the voltage in the electrical conductor.

8. The method according to claim 1, comprising:
acquiring a set of reference samples comprising a first sub-set corresponding to the first class and a second sub-set corresponding to the second class, and
driving the classification model with at least a part of the set of reference samples.

9. The method according to claim 1, comprising:
acquiring a set of reference samples comprising a first sub-set corresponding to the first class and a second sub-set corresponding to the second class,
determining a mean Moy and a standard deviation S for the samples of the set of reference samples,
normalizing values of the set of reference samples so as to obtain a set of normalized reference samples, a normalized value $Eref\_N_k$ of a reference sample $Eref_k$ being equal to:

$$Eref_{N_k} = \left(\frac{Eref_k - Moy}{S}\right)$$

driving the classification model with at least a part of values of the set of normalized reference samples.

10. A medium voltage or high voltage electrical device, the electrical device comprising:
an electrical conductor,
a sensor configured for supplying an oscillating signal associated with an insulator of the electrical conductor, and
an electronic control unit configured to perform, for classifying at least one partial discharge emitted in the insulator of the electrical conductor and allowing the at least one partial discharge to be classified from between at least a first class and a second class distinct from the first class, at least the following:

obtaining a set of samples, each sample of the set of samples corresponding to a respective at least one partial discharge emitted in the insulator of the electrical conductor, wherein each sample of the set of samples is measured with the sensor, determining a duration separating two consecutive samples of the set of samples, determining a classification model by automatic learning based on at least one statistical quantity of the samples of the set of samples, wherein the at least one statistical quantity of the samples of the set of samples comprises the duration separating the two consecutive samples of the set of samples, acquiring a new sample corresponding to at least one new partial discharge, and determining a class of the at least one new partial discharge based on the classification model.

11. The electrical device according to claim 10, wherein the sensor is configured for supplying a signal representative of a vibration of the insulator of the electrical conductor.

* * * * *